United States Patent [19]

Kashimura

[11] Patent Number: 4,924,118
[45] Date of Patent: May 8, 1990

[54] PROGRAMMABLE LOGIC ARRAY WITH INTERFACIAL PLANE

[75] Inventor: Masahiko Kashimura, Tokyo, Japan

[73] Assignee: NEC Corporation, Tokyo, Japan

[21] Appl. No.: 315,652

[22] Filed: Feb. 27, 1989

[30] Foreign Application Priority Data

Feb. 29, 1988 [JP] Japan .................. 63-48312

[51] Int. Cl.⁵ .......................................... H03K 19/177
[52] U.S. Cl. .................................. 307/468; 307/452; 307/469; 307/481
[58] Field of Search .............................. 307/451–453, 307/465, 468, 469, 481, 246; 364/716

[56] References Cited

U.S. PATENT DOCUMENTS

| | | | |
|---|---|---|---|
| 4,661,728 | 4/1987 | Kashimura | 307/468 |
| 4,687,959 | 8/1987 | Eitrheim et al. | 307/469 X |
| 4,697,105 | 9/1987 | Moy | 307/465 |
| 4,740,721 | 4/1988 | Chung et al. | 307/452 X |
| 4,760,290 | 7/1988 | Martinez | 307/481 X |
| 4,764,691 | 8/1988 | Jochem | 307/468 |
| 4,769,562 | 9/1988 | Ghisio | 307/481 X |
| 4,831,285 | 5/1989 | Gaiser | 364/716 X |
| 4,841,174 | 6/1989 | Chung et al. | 307/452 X |

Primary Examiner—David Hudspeth
Attorney, Agent, or Firm—Foley & Lardner, Schwartz, Jeffery, Schwaab, Mack, Blumenthal & Evans

[57] ABSTRACT

A programmable logic array has an interfacial plane between an AND plane and an OR plane for relaying the result of the AND operation to the OR plane, and the interfacial plane has intermediate nodes for the relaying functions which are simultaneously charged up to a high voltage level and selectively discharged to a low voltage level depending upon the result of the AND operation, wherein field effect transistors are provided for the selective discharging operation and simultaneously gated by a control signal line, so that only the gate capacitances of the field effect transistors are coupled to the control signal line, thereby improving the operation speed of the programmable logic array.

5 Claims, 4 Drawing Sheets

PRIOR-ART

PRIOR-ART

PROGRAMMABLE LOGIC ARRAY WITH INTERFACIAL PLANE

FIELD OF THE INVENTION

This invention relates to a semiconductor device and, more particularly, to a programmable logic array.

BACKGROUND OF THE INVENTION

A typical example of the programmable logic array is illustrated in FIG. 1 of the drawings. The programmable logic array is associated with a plurality of ground level lines 1, a plurality of power supply lines 2, a precharging line 3 propagating a precharging signal, a plurality of complementary precharging lines 4 each propagating a complementary signal of the precharging signal, a control signal line 5 for a control signal, input signal lines 6 and 7, and output signal lines 8 and 9. All of the lines 1 to 9 extend in parallel to one another. The programmable logic array is further associated with a plurality of product lines 11, 12, 13, 14, 15 and 16, and the product lines 11 to 13 and 14 to 16 are provided in association with an AND plane 17 and an OR plane, respectively.

The AND plane is formed by using n-channel type field effect transistors 21, 22, 23 and 24, and the n-channel type field effect transistors 21 and 22 are coupled between the ground line 1 and the product lines 11 and 12, respectively. However, the n-channel type field effect transistors 23 and 24 are coupled between the ground line 1 and the product lines 12 and 13, respectively. The n-channel type field effect transistors 21 and 22 are gated by the input signal line 6, and, on the other hand, the n-channel type field effect transistors 23 and 24 are coupled at the gate electrodes thereof to the input signal line 7. All of the product lines 11, 12 and 13 are simultaneously precharged to a positive high voltage level Vcc through p-channel type field effect transistors 25, 26 and 27 with the complementary precharging signal of a low voltage level on the line 4.

The programmable logic array is further provided with n-channel type field effect transistors 28, 29 and 30 respectively gated by the product lines 11, 12 and 13, and the n-channel type field effect transistors 28, 29 and 30 are coupled between the control signal line 5 and intermediate nodes 31, 32 and 33, respectively.

On the other hand, the OR plane is formed by n-channel type field effect transistors 34, 35 and 36 the gate electrodes of which are coupled to the product lines 14, 15 and 16, respectively. The n-channel type field effect transistors 34 and 36 are coupled in parallel between the ground line 1 and the output signal line 8, but the n-channel type field effect transistor 35 is coupled between the ground line 1 and the output signal line 9. For a precharging operation of the intermediate nodes 31, 32 and 33, p-channel type field effect transistors 37, 38 and 39 are coupled between the power source line 2 and the intermediate nodes 31, 32 and 33, respectively, and the p-channel type field effect transistors 37, 38 and 39 are simultaneously gated by the complementary precharging line 4. N-channel type field effect transistors 40, 41 and 42 are provided in association with the product lines 14, 15 and 16 and coupled between the ground line 1 and the product lines 14, 15 and 16. The n-channel type field effect transistors 40, 41 and 42 are coupled at the gate electrodes thereof to the precharging line 3 for discharging the product lines 14, 15 and 16. The control signal line 5 is coupled to an inverter circuit 46 which is responsive to a control signal and provides a conduction path between a source of the positive voltage level and the control signal line 5, the inverter circuit 46 is formed by a series combination of a p-channel type field effect transistor and an n-channel type field effect transistor coupled between the source of positive voltage Vdd and the ground terminal.

Description is made for an operation of the programmable logic array with reference to FIG. 2 of the drawings. In FIG. 2, alphabetic letters "H" and "L" are indicative of the high voltage level and the low voltage level, respectively. If the programmable logic array is shifted into a precharging mode of operation at time t1, the precharging signal line 3 goes up to the high voltage level and the complementary precharging lines 4 conversely go down to the low voltage level. At time t1, when the inverter circuit 46 provides the conduction path between the source of positive voltage level and the control signal line 5 with the control signal of the low voltage level, the control signal line 5 is increased in voltage level, but the both of the input signal lines 6 and 7 are decreased to the low voltage level. With the low voltage level on the complementary signal line 4, the p-channel type field effect transistors 25, 26 and 27 simultaneously turn on to provide conduction paths between the power supply line 2 and the product lines 11, 12 and 13, respectively, and, accordingly, all of the product lines 11 to 13 are gradually precharged to the high voltage level. On the contrary, the product lines 14, 15 and 16 are discharged to the low voltage level, because the n-channel type field effect transistors 40, 41 and 42 provide conduction paths between the product lines 14 to 16 and the ground line 1.

The low voltage level is supplied from the input signal lines 6 and 7 to the n-channel type field effect transistors 21, 22, 23 and 24, so that no n-channel type field effect transistor turns on, thereby allowing the product lines 11 to 13 to remain in the high voltage level. This results in that all of the n-channel type field effect transistors 28, 29 and 30 turn on to provide conduction paths between the control signal line 5 and the respective intermediate nodes 31, 32 and 33.

At time t1, the control signal line 5 begins to rise to the high voltage level as described hereinbefore, and the n-channel type field effect transistors 28 to 30 in the on-states are transparent for the high voltage level on the control signal line 5. The intermediate nodes 31, 32 and 33 have been precharged in the presence of the low voltage level on the complementary precharging line 4, and no fluctuation in voltage level takes place at the intermediate nodes 31 to 33. With the high voltage level at the intermediate nodes 31 to 33, the p-channel type field effect transistors 43, 44 and 45 remain in the respective off-states, so that product lines 14 to 16 also remain in the low voltage level. If the product lines 14 to 16 keep low, no n-channel type field effect transistor turns on, so that the output signal lines 8 and 9 remain in the high voltage level. In this manner, the precharging operation is completed at time t2.

After the precharging operation, the input signal lines 6 and 7 are changed in voltage level depending upon input data bits supplied thereto. In this access, the input signal line 7 is assumed to be changed to the high voltage level, and, for this reason, the n-channel type field effect transistors 23 and 24 turn on to discharge the product lines 12 and 13, however, the n-channel type field effect transistor 21 remains off in the presence of the low voltage level on the input signal line 6. Then, the product line 11 allows the n-channel type field effect transistor 28 to be turned on for keeping the conduction path between the intermediate node 31 and the control line 5, however, the product lines 12 and 13 in the low voltage level cause the n-channel type field effect transistors 29 and 30 to turn off for blocking the conduction paths between the control signal line 5 and the intermediate nodes 32 and 33.

At time t3, the control signal line 5 is decreased in voltage level due to the control signal of the high voltage level applied to the inverter circuit 46, and, accordingly, the intermediate node 31 goes down to the low voltage level. However, the n-channel type field effect transistors 29 and 30 in the off-states prevent the respective intermediate nodes 32 and 33 from propagation of the low voltage level on the control signal line 5. When the intermediate node 31 is in the low voltage level, the pmos 43 turns on to charge the product line 14 toward the high voltage level, however, the product lines 15 and 16 remain in the low voltage level, because the p-channel type field effect transistors 44 and 45 keep off in the presence of the high voltage level at the intermediate nodes 32 and 33. This fluctuation in voltage level on the product line 14 results in that the nmos 34 turn on for discharging the output signal line 8, however, no fluctuation takes place in the voltage level on the output signal line 9.

In this instance, the output signal line 8 is shifted to the low voltage level with the exception of the coexistence of the input signal lines 6 and 7 in the high voltage level. In other words, the input signal on the signal line 6 is ANDed with the input signal on the signal line 7 to produce the output signal on the signal line 8. On the other hand, the signal line 9 goes down to the low voltage level in the coexistence of the input signals in the low voltage level, however, the high voltage level takes place on the output signal line 9 when at least one input signal remains in the high voltage level. Then, the output signal line 9 is used for the OR operation on the input signals. Though not shown in the drawings, various Boolean operations such as, for example, the NOR operation are further achieved on the basis of the AND operation as well as the OR operation.

A problem is encountered in the prior-art programmable logic array in that a huge field effect transistors should be installed to form the inverter circuit 46. This is because of the fact that the inverter circuit 46 should not only charge up an extremely large parasitic capacitance coupled to the control signal line 5 but also discharge the accumulated charges. In detail, as to the parasitic capacitance related to the product line 11 only, the inverter circuit 46 is expected to charge the source junction capacitance of the nmos 28, the gate capacitance of the nmos 28, the drain junction capacitance of the nmos 28, the gate capacitance of the pmos 31 and the drain junction capacitance of the pmos 37. Assuming now that the number of the product lines related to the OR plane 17 is Np, the amount of the total parasitic capacitance C5 coupled to the control signal line 5 is given by the following equation $$C5 = Np(Cs28 + Cg28 + Cd28 + Cg43 + Cd37)$$

where Cs28, Cg28 and Cd28 are the source junction capacitance, the gate capacitance and the drain junction capacitance of each field effect transistor between the control line 5 and each of the intermediate nodes, Cg43 is the gate capacitance of each field effect transistor coupled between the power supply line 2 and each of the product lines 14 to 16, and Cd37 is the drain junction capacitance of each field effect transistor coupled between the power supply line 2 and each of the intermediate nodes. In order to charge up this extremely large parasitic capacitance, the field effect transistor serving as the inverter circuit 46 needs to have a broad channel width, and, for this reason, a large amount of area is consumed by formation of the inverter circuit 46. On the other hand, if the inverter circuit 46 is small in size, a long time period is consumed for each access due to the small current driving capability of the small driver transistor. In other words, there is a trade-off between the operation speed and the occupation area for the inverter circuit 46.

SUMMARY OF THE INVENTION

It is therefore an important object of the present invention to provide a programmable logic array the circuit arrangement of which allows the inverter circuit to be formed by relatively small component transistors.

It is also an important object of the present invention to provide a programmable logic array which has a small inverter circuit for charging up the parasitic capacitance coupled to the control signal line without sacrifice of the operation speed.

In accordance with the present invention, there is provided a programmable logic array fabricated on a semiconductor chip, comprising: a) a first logical plane supplied with a plurality of input signals and achieving a first logical operation to produce a plurality of first logical signals; b) a second logical plane supplied with a plurality of intermediate signals and achieving a second logical operation to produce a plurality of output signals; and c) an interfacial plane responsive to the first logical signals and producing the intermediate signals, the interfacial plane is provided between first and second constant voltage lines different in voltage level from one another and comprises plural series combinations of first, second and third field effect transistors coupled in parallel between the first and second constant voltage lines, each first field effect transistor coupled at one end thereof to the first constant voltage line is gated by a precharge control line, each third field effect transistor coupled at one end thereof to the second constant voltage line is gated by a control signal line, each of the second field effect transistors has a gate electrode supplied with each of the first logical signals, and each of the intermediate signals is produced between each first field effect transistor and each second field effect transistor.

BRIEF DESCRIPTION OF THE DRAWINGS

The features and advantages of a programmable logic array according to the present invention will be more clearly understood from the following description taken in conjunction with the accompanying drawings in which.

DESCRIPTION OF THE PREFERRED EMBODIMENT

Figure 1:
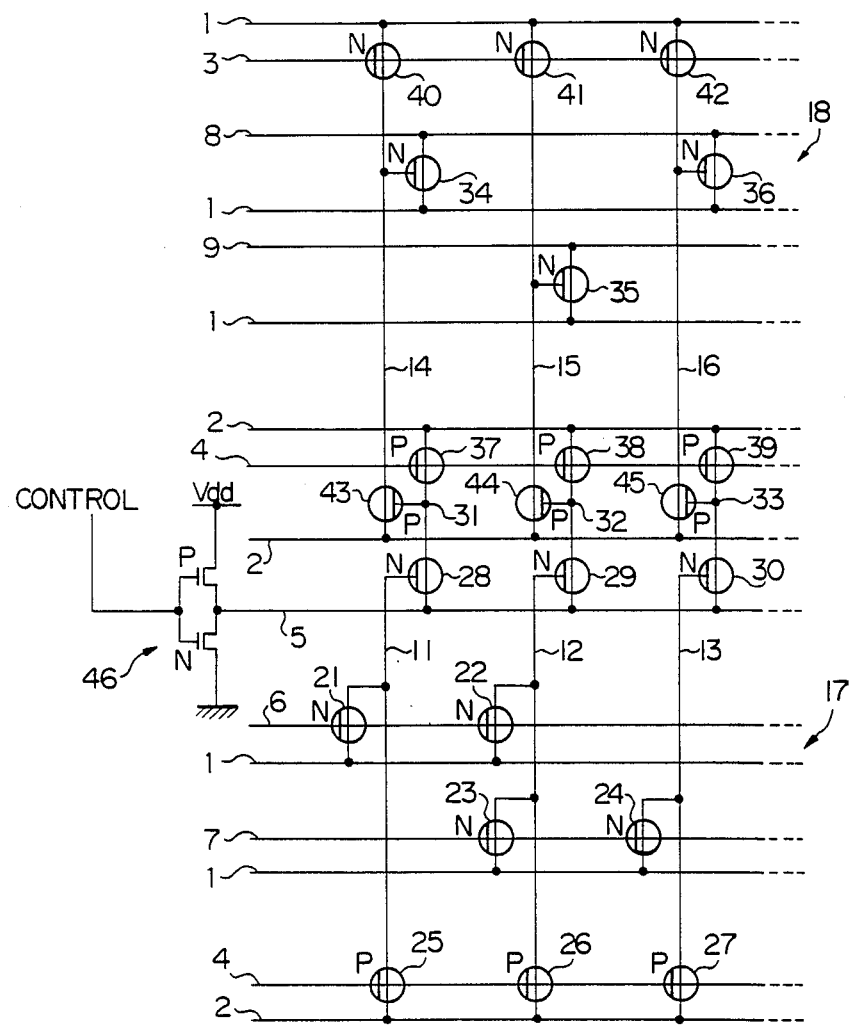
FIG. 1 is a diagram showing the circuit arrangement of a prior-art programmable logic array.
Figure 2:
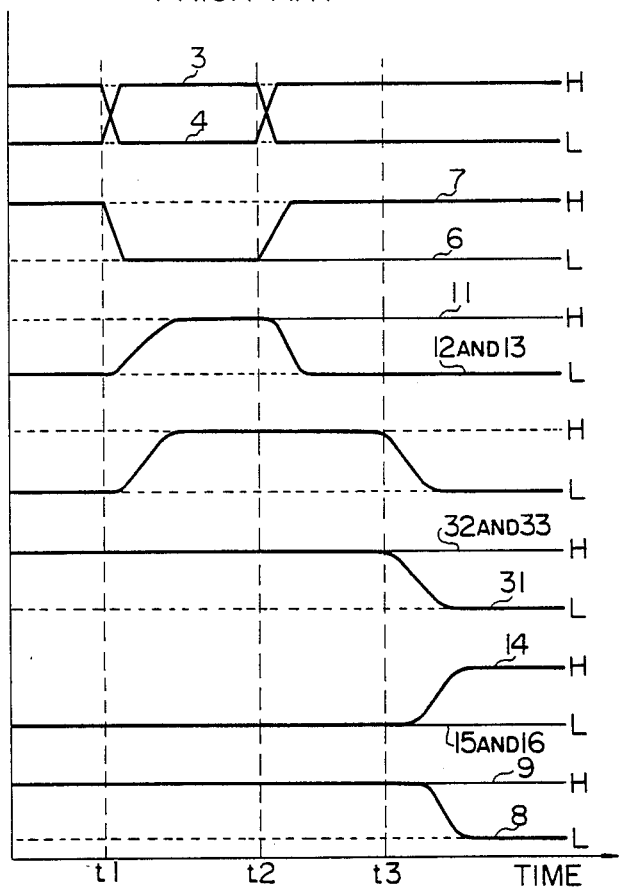
FIG. 2 is a diagram showing the waveforms of essential signals produced in the prior-art programmable logic array.
Figure 3:
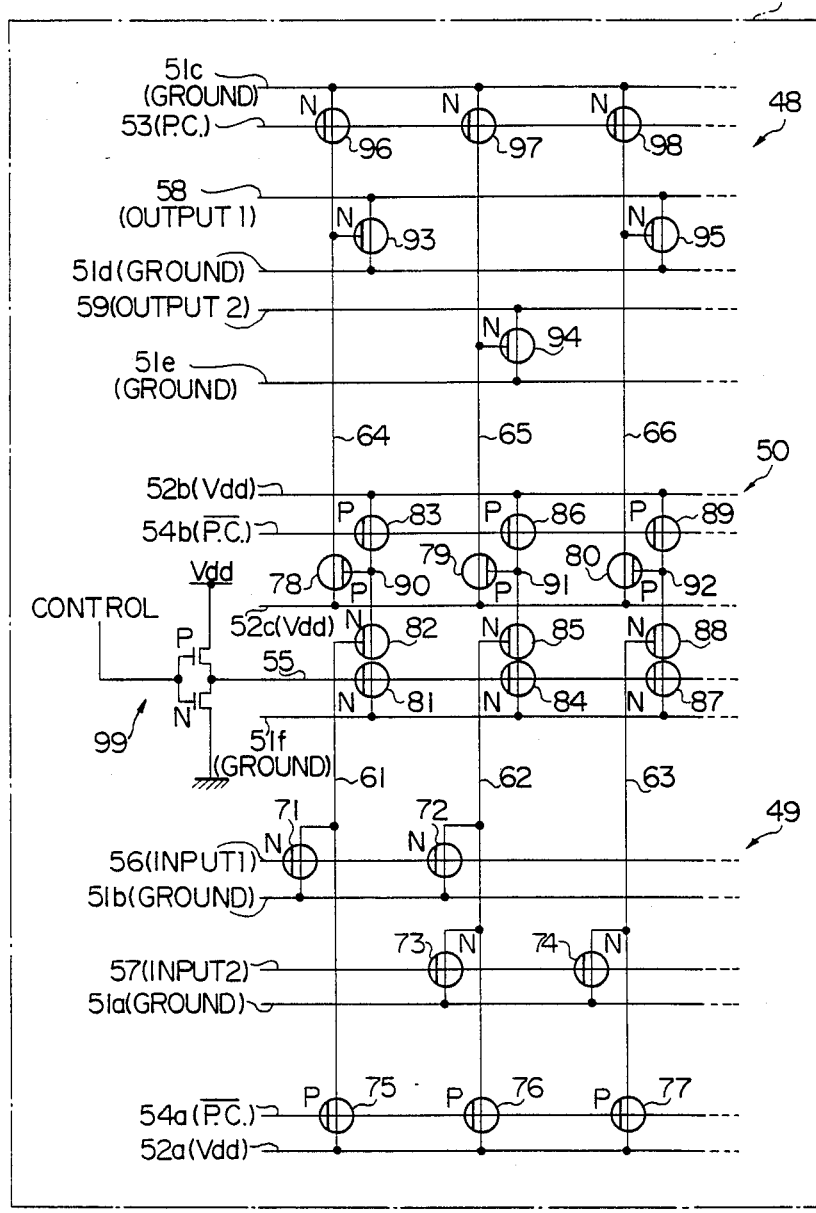
FIG. 3 is a diagram showing the circuit arrangement of a programmable logic array embodying the present invention.

Referring to FIG. 3 of the drawings, a programmable logic array embodying the present invention is fabricated on a semiconductor chip 47 and largely comprises an AND plane 48, an OR plane 49, an interfacial plane 50 and a control circuit. FIG. 3 merely shows a part of the programmable logic array. The AND plane 49 is associated with a plurality of ground level lines 51a and 51b, a power supply line 52a, a complementary precharging lines 54a for propagation of a complementary signal of a precharging signal, and input signal lines 56 and 57 for input signals, and the OR plane 48 is associated with a plurality of ground level lines 51c 51d and 51e, a precharging line 53 for propagating a precharging signal, and output signal lines 58 and 59. Moreover, the interfacial plane 50 is accompanied by a ground line 51f, a plurality of power supply lines 52b and 52c, a complementary precharging lines 54b, and a control signal line 55 for a control signal.

The AND plane 49 is further associated with a plurality of product lines 61, 62 and 63, but the OR plane is related to product lines 64, 65 and 66.

The AND plane 49 is formed by using n-channel type field effect transistors 71, 72, 73 and 74, and the n-channel type field effect transistors 71 and 72 are coupled between the ground line 51b and the product lines 61 and 62, respectively. However, the n-channel type field effect transistors 73 and 74 are coupled between the ground line 51a and the product lines 62 and 63, respectively. The n-channel type field effect transistors 71 and 72 are gated by the input signal line 56, and, on the other hand, the n-channel type field effect transistors 73 and 74 are coupled at the gate electrodes thereof to the input signal line 57. All of the product lines 61, 62 and 63 are simultaneously precharged to a positive high voltage level through p-channel type field effect transistors 75, 76 and 77 with the complementary precharging signal of a low voltage level on the line 54a.

The interfacial plane 50 is provided with three series combinations of field effect transistors together with three p-channel type field effect transistors 78, 79 and 80 arranged between the ground line 51f and the power supply line 52b, and each of the three series combinations comprises two n-channel type field effect transistors 81, 84 or 87, and 82, 85 and 88 and a p-channel type field effect transistor 83, 86 or 89. The p-channel type field effect transistors 78 to 80 are respectively gated by intermediate nodes 90, 91 and 92, and the intermediate nodes 90 to 92 are provided between the nmos 82 and the pmos 83, between the nmos 85 and the pmos 86 and between the nmos 88 and the pmos 89, respectively. The n-channel type field effect transistors 82, 85 and 88 are respectively gated by the product lines 61, 62 and 63, and the control signal line 55 is shared by the n-channel type field effect transistors 81, 84 and 87 for simultaneous gate operations. The complementary precharging line 54b is also shared by the p-channel type field effect transistors 83, 86 and 89, so that the p-channel type field effect transistors 83, 86 and 89 simultaneously turn on or off depending upon the voltage level on the complementary precharging line 54b.

The OR plane 48 is formed by n-channel type field effect transistors 93, 94 and 95 the gate electrodes of which are coupled to the product lines 64, 65 and 66, respectively. The n-channel type field effect transistors 93 and 95 are coupled in parallel between the ground line 51d and the output signal line 58, but the n-channel type field effect transistor 94 is coupled between the ground line 51e and the output signal line 59. N-channel type field effect transistors 96, 97 and 98 are provided in association with the product lines 64, 65 and 66 and coupled between the ground line 51c and the product lines 64, 65 and 66. The n-channel type field effect transistors 96, 97 and 98 are coupled at the gate electrodes thereof to the precharging line 53 for discharging the product lines 64, 65 and 66.

The control signal line 55 is coupled at one end thereof to an inverter circuit 99 forming part of the control circuit which is responsive to a start signal for supplying the control signal line 11 with either high or low voltage level. The inverter circuit 99 is formed by a p-channel type field effect transistor and an n-channel type field effect transistor coupled between the source of positive voltage level and the ground terminal. When the start signal is shifted to the low voltage level, the inverter circuit 99 provides the conduction path between the source of positive voltage and the control signal line 55. However, the control signal line 55 is isolated from the source of the high voltage level in the absence of the start signal of the low voltage level. The inverter circuit 99 is formed by the component transistors smaller in size than that of the inverter circuit 46 by virtue of the circuit arrangement of the programmable logic array embodying the present invention.

Figure 4:
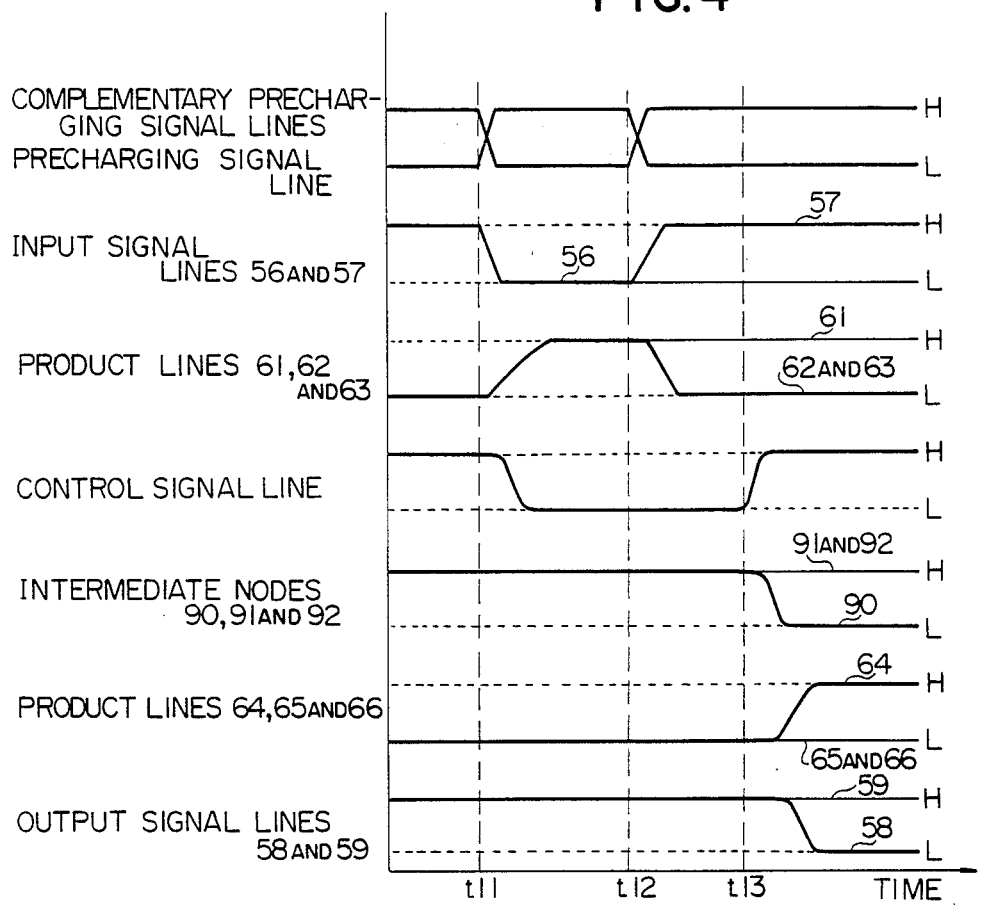
FIG. 4 is a diagram showing the waveforms of essential signals produced in the programmable logic array shown in FIG. 3.

Description is made for an operation of the programmable logic array with reference to FIG. 4 of the drawings. In FIG. 4, alphabetic letters "H" and "L" are indicative of the high voltage level and the low voltage level, respectively, and the high and low voltage levels are selected to be a positive high voltage value and the ground voltage value. If the programmable logic array is shifted into a precharging mode of operation at time t11, the precharging signal line 53 goes up to the high voltage level and the complementary precharging lines 54a and 54b conversely go down to the low voltage level. At time t11, the start signal is shifted to the the high voltage level, and, accordingly, the inverter circuit 99 provides the conduction path between the ground terminal and the control signal line 55. For this reason, the control signal line 55 is decreased in voltage level, and the both of the input signal lines 6 and 7 go down to the low voltage level. With the low voltage level on the complementary signal line 54a, the p-channel type field effect transistors 75, 76 and 77 simultaneously turn on to provide conduction paths between the power supply line 52a and the product lines 61, 62 and 63, respectively, and, accordingly, all of the product lines 61 to 63 are gradually precharged to the high voltage level. On the contrary, the product lines 64, 65 and 66 are discharged to the low voltage level, because the n-channel type field effect transistors 96, 97 and 98 provide conduction paths between the product lines 64 to 66 and the ground line 51c in the presence of the precharging signal of the high voltage level.

The low voltage level is supplied from the input signal lines 56 and 57 to the n-channel type field effect transistors 71, 72, 73 and 74, so that no n-channel type field effect transistor turns on, thereby allowing the product lines 61 to 63 to remain in the high voltage level. This results in that all of the n-channel type field effect transistors 82, 85 and 88 turn on to electrically couple the intermediate nodes 90, 91 and 92 to the n-channel type field effect transistors 81, 84 and 87, respectively.

The control signal line 55 has lowered to the low voltage level, so that the n-channel type field effect transistors 81, 84 and 87 remain in the off states, thereby isolating the intermediate nodes 90 to 92 from the ground line 51f. On the other hand, the complementary precharging line 54b in the low voltage level causes the p-channel type field effect transistors 83, 86 and 89 to turn on, and, accordingly, the power supply line 52b charges the intermediate nodes 90, 91 and 92 to the high voltage level. Thus, the intermediate nodes 90, 91 and 92 are precharged to the high voltage level, so that the p-channel type field effect transistors 78, 79 and 80 are kept in the off states, thereby electrically isolating the product lines 64, 65 and 66 from the power supply line 52c. In this manner, the precharging operation is completed at time t12, and the precharging signal and the complementary precharging signal are recovered to the low voltage level and the high voltage level, respectively.

After the precharging operation, the input signal lines 6 and 7 are changed in voltage level depending upon input data bits supplied thereto at time t12. In this access, the input signal line 7 is assumed to be changed to the high voltage level, and, for this reason, the n-channel type field effect transistors 73 and 74 turn on to discharge the product lines 62 and 63, however, the n-channel type field effect transistors 71 and 72 remain off in the presence of the low voltage level on the input signal line 56. Then, the product lines 62 and 63 are decreased in voltage level, however, the product line 61 remains in the high voltage level. The product line 61 in the high voltage level allows the n-channel type field effect transistor 82 to be turned on for keeping the conduction path between the intermediate node 90 and the nmos 81, however, the product lines 62 and 63 in the low voltage level cause the n-channel type field effect transistors 85 and 88 to turn off for blocking the conduction paths between the n-channel type field effect transistors 84 and 87 and the intermediate nodes 91 and 92.

At time t13, the start signal allows the inverter circuit 99 to provide the conduction path between the source of positive voltage and the control signal line 55, so that the control signal line 55 is increased in voltage level. With the high voltage level on the control signal line 55, the n-channel type field effect transistors 81, 84 and 87 simultaneously turn on, however, only intermediate node 90 is discharged to the low voltage level. This is because of the fact that the nmos 82 has been turned on, however, the n-channel type field effect transistors 85 and 88 block the intermediate nodes 91 an 92 from the control line 55. This results in that the intermediate node 90 goes down to the low voltage level, however, the other intermediate nodes 91 and 92 remain in the high voltage level. When the intermediate node 90 is in the low voltage level, the pmos 78 turns on to charge the product line 64 toward the high voltage level, however, the product lines 65 and 66 remain in the low voltage level, because the p-channel type field effect transistors 79 and 80 keep off in the presence of the high voltage level at the intermediate nodes 91 and 92. This fluctuation in voltage level on the product line 64 results in that the nmos 94 turn on for discharging the output signal line 58, however, no fluctuation takes place in the voltage level on the output signal line 59.

In this instance, the output signal line 58 is shifted to the low voltage level with the exception of the coexistence of the input signal lines 56 and 57 in the high voltage level. In other words, the input signal on the signal line 56 is ANDed with the input signal on the signal line 57 to produce the output signal on the signal line 58. On the other hand, the signal line 59 goes down to the low voltage level in the coexistence of the input signals in the low voltage level, however, the high voltage level takes place on the output signal line 59 when at least one input signal remains in the high voltage level. Then, the output signal line 59 is used for the OR operation on the input signals. Though not shown in the drawings, various Boolean operations such as, for example, the NOR operation are further achieved on the basis of the AND operation as well as the OR operation.

Thus, the programmable logic array according to the present invention is basically similar in circuit behavior to the prior art programmable logic array with the exception of the inverter circuit 99. However, although the component transistors of the inverter circuit are small in size, the control signal line 55 is rapidly charged up to the high voltage level from time t13. This is because of the fact that the gate capacitances of the n-channel type field effect transistors 81, 84 and 87 are coupled to the control signal line 55 as a parasitic capacitance C55. Then, the amount of the parasitic capacitance C55 is calculated as $$C55 = Np \times Cg$$

where Np is the number of the product lines associated with the OR plane 49 and Cg is the gate capacitance of each nmos coupled between each of the intermediate nodes 90, 91 and 92 and each of the n-channel type field effect transistors 81, 84 and 85. The amount of the parasitic capacitance C55 roughly ranges from a third to a half of the amount of the parasitic capacitance C5, so that the programmable logic array according to the present invention is reduced in occupation area without sacrifice of the operation speed.

Although particular embodiments of the present invention have been shown and described, it will be obvious to those skilled in the art that various changes and modifications may be made without departing from the spirit and scope of the present invention. For example, the AND plane 49 and the OR plane 48 are formed by using n-channel type field effect transistors, however, these planes may be implemented by p-channel type field effect transistors. In this implementation, the voltage levels be changed from one to the other.

What is claimed is:

1. A programmable logic array fabricated on a semiconductor chip, comprising:
   (a) a first logical plane supplied with a plurality of input signals and achieving a first logical operation to produce a plurality of first logical signals;
   (b) a second logical plane supplied with a plurality of intermediate signals and achieving a second logical operation to produce a plurality of output signals; and
   (c) an interfacial plane responsive to said first logical signals and producing said intermediate signals, wherein said interfacial plane is provided between first and second constant voltage lines different in voltage level from one another and comprises plural series combinations of first, second and third field effect transistors coupled in parallel between the first and second constant voltage lines, each first field effect transistor coupled at one end thereof to said first constant voltage line and being gated by a precharge control line, each third field effect transistor coupled at one end thereof to said second constant voltage line and being gated by a control signal line, each of said second field effect transistors having a gate electrode supplied with each of said first logical signals, each of said intermediate signals being produced between each first field effect transistor and each second field effect transistor.

2. A programmable logic array as set forth in claim 1, in which said first and second constant voltage lines have a positive high voltage level and a ground voltage level, respectively.

3. A programmable logic array as set forth in claim 2, in which each of said first field effect transistor is formed of a p-channel type field effect transistor and in which each second field effect transistor and each third field effect transistor are of an n-channel type field effect transistor.

4. A programmable logic array fabricated on a semiconductor chip, comprising:
 (a) first and second sources of voltage level respectively producing first and second voltage levels different form each other;
 (b) a precharging signal line propagating a precharging signal of said first voltage level;
 (c) a complementary precharging signal line propagating a complementary precharging signal of said second voltage level;
 (d) at least first and second product lines;
 (e) a first logical plane associated with a plurality of input signal lines including a first input signal line, said first logical plane having a first field effect transistor coupled between said first source of voltage level and said first product line and gated by said complementary precharging signal line and a second field effect transistor coupled between the first product line and said second source of voltage level and gated by said first input signal line;
 (f) a second logical plane associated with a plurality of output signal lines including first and second output signal lines, said second logical plane having a third field effect transistor coupled between the first output line and said second source of voltage level and gated by said second product line and a fourth field effect transistor coupled between the second source of voltage level and the second product line and gated by said precharging signal line; and
 (g) an interfacial plane associated with a control signal line and having a series combination of fifth, sixth and seventh field effect transistors coupled between said second source of voltage level and said first source of voltage level, an intermediate node provided between the sixth and seventh field effect transistors and an eighth field effect transistor coupled between the first source of voltage level and said second product line and gated by the intermediate node, wherein said fifth, sixth and seventh field effect transistors are gated by said control signal line, said first product line and said complementary precharging signal line, respectively.

5. A programmable logic array as set forth in claim 4, in which said second, third, fourth, fifth and sixth field effect transistors are formed by n-channel type field effect transistors, respectively, and in which said first, seventh and eighth field effect transistors are formed by p-channel type field effect transistors, respectively.

* * * * *